United States Patent
Wu et al.

(10) Patent No.: US 11,757,035 B2
(45) Date of Patent: Sep. 12, 2023

(54) LDMOS TRANSISTOR AND METHOD FOR MANUFACTURING THE SAME

(71) Applicant: HANGZHOU SILICON-MAGIC SEMICONDUCTOR TECHNOLOGY CO., LTD., Hangzhou (CN)

(72) Inventors: Bing Wu, Zhejiang (CN); Chien Ling Chan, Zhejiang (CN); Liang Tong, Zhejiang (CN)

(73) Assignee: HANGZHOU SILICON-MAGIC SEMICONDUCTOR TECHNOLOGY CO., LTD., Hangzhou (CN)

( * ) Notice: Subject to any disclaimer, the term of this patent is extended or adjusted under 35 U.S.C. 154(b) by 0 days.

(21) Appl. No.: 17/735,899

(22) Filed: May 3, 2022

(65) Prior Publication Data
US 2022/0262947 A1    Aug. 18, 2022

Related U.S. Application Data

(62) Division of application No. 16/247,007, filed on Jan. 14, 2019, now Pat. No. 11,355,631.

(30) Foreign Application Priority Data

Jan. 19, 2018   (CN) .......................... 201810055437.3

(51) Int. Cl.
*H01L 21/308*   (2006.01)
*H01L 29/78*   (2006.01)
(Continued)

(52) U.S. Cl.
CPC ........ *H01L 29/7816* (2013.01); *H01L 21/266* (2013.01); *H01L 21/26513* (2013.01);
(Continued)

(58) Field of Classification Search
CPC ........... H01L 29/7816; H01L 21/26513; H01L 21/266; H01L 21/308; H01L 21/32139;
(Continued)

(56) References Cited

U.S. PATENT DOCUMENTS 5,252,848 A * 10/1993 Adler .................. H01L 29/1087
257/E29.054
9,064,896 B2 * 6/2015 Terrill ............... H01L 29/66696
(Continued)

*Primary Examiner* — Eugene Lee
(74) *Attorney, Agent, or Firm* — Alston & Bird LLP

(57) ABSTRACT

An LDMOS transistor and a method for manufacturing the same are provided. The method includes: forming an epitaxial layer on a substrate, forming a gate structure on an upper surface of the epitaxial layer, forming a body region and a drift region in the epitaxial layer, forming a source region in the body region, forming a first insulating layer on the gate structure and an upper surface of the epitaxial layer and, forming a shield conductor layer on the first insulating layer, forming a second insulating layer covering the shield conductor layer, forming a first conductive path, to connect the source region with the substrate, and forming a drain region in the drift region. By forming the first conductive path which connects the source region with the substrate, the size of the LDMOS transistor and the resistance can be reduced.

12 Claims, 9 Drawing Sheets

(51) Int. Cl.
    *H01L 29/66*     (2006.01)
    *H01L 29/10*     (2006.01)
    *H01L 29/40*     (2006.01)
    *H01L 29/08*     (2006.01)
    *H01L 21/265*     (2006.01)
    *H01L 21/3213*     (2006.01)
    *H01L 29/417*     (2006.01)
    *H01L 29/06*     (2006.01)
    *H01L 21/266*     (2006.01)

(52) U.S. Cl.
CPC ...... *H01L 21/308* (2013.01); *H01L 21/32139* (2013.01); *H01L 29/0653* (2013.01); *H01L 29/0865* (2013.01); *H01L 29/0882* (2013.01); *H01L 29/1087* (2013.01); *H01L 29/1095* (2013.01); *H01L 29/401* (2013.01); *H01L 29/402* (2013.01); *H01L 29/4175* (2013.01); *H01L 29/41766* (2013.01); *H01L 29/66659* (2013.01); *H01L 29/66681* (2013.01); *H01L 29/7835* (2013.01)

(58) Field of Classification Search
CPC ............. H01L 29/0653; H01L 29/0865; H01L 29/0882; H01L 29/1087; H01L 29/1095; H01L 29/401; H01L 29/402; H01L 29/4175; H01L 29/66681
See application file for complete search history.

(56) References Cited

U.S. PATENT DOCUMENTS 9,425,304 B2 *   8/2016   Zhang ................ H01L 29/0626
2001/0028095 A1 *  10/2001   Yin ................... H01L 21/31144
                                                                   257/411

* cited by examiner

LDMOS TRANSISTOR AND METHOD FOR MANUFACTURING THE SAME

CROSS REFERENCE TO RELATED APPLICATION

The present application is a divisional application of, and claims priority to U.S. patent application Ser. No. 16/247,007, titled "LDMOS TRANSISTOR AND METHOD FOR MANUFACTURING THE SAME", filed on Jan. 14, 2019, which claims priority to Chinese Patent Application No. 201810055437.3, titled "LDMOS TRANSISTOR AND METHOD FOR MANUFACTURING THE SAME", filed on Jan. 19, 2018 with the Chinese Patent Office, both are incorporated herein by reference in its entirety.

FIELD

The present disclosure relates to the technical field of semiconductor devices, and in particular to an LDMOS (laterally diffused metal oxide semiconductor) transistor and a method for manufacturing the same.

BACKGROUND

In electronic systems, a voltage regulator such as a DC-to-DC (direct current to direct current) converter, is used for supplying a stable voltage source. An efficient DC-to-DC converter is particularly required for battery management of a low-power device (for example, a notebook or a mobile phone). A switching regulator generates an output voltage by converting an input DC voltage into a high frequency voltage, and then filtering the high frequency input voltage to generate the output DC voltage. Specifically, the switching regulator includes a power switch for alternatively coupling a DC voltage source (for example, a battery) to a load (for example, an integrated circuit (TC)) and decoupling the DC voltage source from the load.

The power switch may be a semiconductor device, such as an MOSFET (metal oxide semiconductor field-effect transistor) and an IGBT (insulated-gate bipolar transistor). A source region of the LDMOS transistor is formed in a body region doped with dopant of a doping type opposite to a conductivity type of the LDMOS transistor. A drain region is formed in a high-resistance drift region doped with dopant of a doping type which is the same as the conductivity type of the LDMOS transistor. A drain of the LDMOS transistor can withstand a high voltage due to the drift region. Therefore, the LDMOS transistor is widely used in switching regulators due to advantages of large drive current, lower on-resistance and higher breakdown voltage.

The LDMOS transistor in the conventional technology, as shown in FIG. 1, includes P-type substrate 901, P-type epitaxial layer 902, P-type doped region 903, P-type body region 904, N-type drift region 905, source region 906, drain region 907, gate region 908, source electrode 909 and drain electrode 910. In the current process of forming the LDMOS transistor, source region 906 located on an upper surface of P-type epitaxial layer 902 is connected with P-type substrate 901 through P-type doped region 903 located in P-type epitaxial layer 902, so that source electrode 909 may be located on a lower surface of P-type substrate 901. A general process for forming such structure includes: performing one or more ion implantation processes, then performing a high temperature annealing process, such that P-type doped region 903 is diffused to a lower surface of P-type epitaxial layer 902.

However, when performing the high temperature annealing process, P-type doped region 903 of the LDMOS transistor is diffused longitudinally and laterally. Therefore, it is difficult to reduce the size of the LDMOS transistor. Moreover, a resistance of P-type doped region 903 adversely affects the LDMOS transistor, thereby affecting the product performance.

SUMMARY

In view of the above, a LDMOS transistor and a method for manufacturing the LDMOS transistor is provided in the present disclosure. A first conductive path with a high aspect ratio is formed in a first region of an epitaxial layer by using a second insulating layer as a hard mask, where the first conductive path extends from a second insulating layer to the first region of the epitaxial layer, and further extends through the first region of the epitaxial layer to the substrate to connect the source region with the substrate. In this way, the size of the LDMOS transistor and the resistance can be reduced, and the product performance can be improved.

According to an aspect of the present disclosure, a method for manufacturing a LDMOS transistor is provided, which includes forming an epitaxial layer doped with dopant of a first doping type on a substrate doped with dopant of the first doping type; forming a gate structure on an upper surface of the epitaxial layer; forming a body region doped with dopant of the first doping type and a drift region doped with dopant of a second doping type in the epitaxial layer, and forming a source region doped with dopant of the second doping type in the body region, where the second doping type is opposite to the first doping type; forming a first insulating layer on the gate structure and an upper surface of the epitaxial layer and; forming a shield conductor layer on the first insulating layer; forming a second insulating layer covering the shield conductor layer; forming a first conductive path by using the second insulating layer as a hard mask, where the first conductive path extends from the second insulating layer to an upper surface of the substrate, to connect the source region with the substrate; and forming a drain region in the drift region.

In an embodiment, the forming the first conductive path includes: forming a first groove by using the second insulating layer as a hard mask, where the first groove extends from the second insulating layer to the upper surface of the substrate, to expose the substrate; and filling the first groove with a conductive material to form the first conductive path, where the first conductive path extends from the second insulating layer toward the substrate, through the shield conductor layer, the first insulating layer, the source region, the body region and the epitaxial layer sequentially to the upper surface of the substrate.

In an embodiment, before filling the first groove, the method further includes: forming a body contact region doped with dopant of the first doping type in the substrate exposed by the first groove, where the body contact region is connected with the source region through the first conductive path.

In an embodiment, after the forming the shield conductor layer, the method further includes: etching the shield conductor layer, to at least partially expose a portion of the first insulating layer which is located on an upper surface of the drift region, where the second insulating layer covers the exposed portion of the first insulating layer.

In an embodiment, the forming the drift region includes: forming a third insulating layer on the second insulating layer and the first conductive path; forming a second groove by using the third insulating layer as a hard mask, where the second groove extends from the third insulating layer toward the epitaxial layer, through the second insulating layer and the first insulating layer sequentially, to an upper surface of the drift region, to expose the drift region; and forming the drain region in the drift region exposed by the second groove.

In an embodiment, the method further includes: forming a second conductive path by filling the second groove with a conductive material, and forming a drain electrode on an upper surface of the third insulating layer, where the drift region is connected with the drain electrode through the second conductive path.

In an embodiment, the forming the gate structure includes: forming agate dielectric layer on the upper surface of the substrate; forming a gate conductor on the gate dielectric layer; forming a silicide layer on the gate conductor; forming a fourth insulating layer on the silicide layer, and etching the fourth insulating layer, the silicide layer, and the gate conductor sequentially, to form the gate structure on the upper surface of the substrate.

In an embodiment, the forming the body region includes: doping a first region of the epitaxial layer with dopant of the first doping type by using the gate structure as a mask, to form the body region.

In an embodiment, the forming the drift region includes: doping a second region of the epitaxial layer with dopant of the second doping type by using the gate structure as a mask, to form the drift region.

In an embodiment, the method further includes: forming a source electrode on a lower surface of the substrate, where the source electrode is electrically connected with the source region and the shield conductor layer through the first conductive path.

In an embodiment, before the forming the first conductive path, the method further includes: etching the shield conductor layer.

According to another aspect of the present disclosure, an LDMOS transistor is provided, which includes: an epitaxial layer doped with dopant of a first doping type, located on a substrate doped with dopant of the first doping type; a gate structure, located on an upper surface of the epitaxial layer; a body region doped with dopant of the first doping type and a drift region doped with dopant of a second doping type located in the epitaxial layer, and a source region doped with dopant of the second doping type located in the body region, where the second doping type is opposite to the first doping type; a first insulating layer, covering the gate structure and the upper surface of the epitaxial layer; a shield conductor layer, located on the first insulating layer; a second insulating layer covering the shield conductor layer; a first conductive path, extending from the second insulating layer to an upper surface of the substrate, where the source region is connected with the substrate through the first conductive path; and a drain region, located in the drift region.

In an embodiment, the first conductive path extends from the second insulating layer toward the substrate, through the shield conductor layer, the first insulating layer, the source region, the body region and the epitaxial layer sequentially to the upper surface of the substrate, to electrically connect the shield conductor layer, the source region and the substrate.

In an embodiment, a portion of the first insulating layer located on the drift region is exposed through the shield conductor layer.

In an embodiment, the LDMOS transistor further includes: a body contact region doped with dopant of the first doping type, located in the substrate, where the body contact region is connected with the source region through the first conductive path.

In an embodiment, the LDMOS transistor further includes: a third insulating layer, located on the second insulating layer; a drain electrode, located on an upper surface of the third insulating layer; and a second conductive path, connecting the drift region with the drain electrode, where the second conductive path extends from the third insulating layer to the drift region.

In an embodiment, the gate structure includes: a gate dielectric layer located on the upper surface of the substrate; a gate conductor located on the gate dielectric layer; a silicide layer located on the gate conductor; and a fourth insulating layer located on the silicide layer.

In an embodiment, the LDMOS transistor further includes: a source electrode located on a lower surface of the substrate.

In the LDMOS transistor according to the embodiments of the present disclosure, the first conductive path with a high aspect ratio is formed in the first region of the epitaxial layer by using the second insulating layer as a hard mask, such that the source region is connected with the substrate through the first conductive path. In this way, the source electrode can be arranged on the lower surface of the substrate, the size of the LDMOS transistor and the resistance can be reduced, and the product performance can be improved.

In the process of forming the first trench, the first insulating layer is etched for the first time to define a position of a first sidewall of a field insulating layer of the LDMOS transistor. In the process of forming the second trench, the first insulating layer is etched for the second time to define a position of a second sidewall of the field insulating layer of the LDMOS transistor. That is, the field insulating layer of the LDMOS transistor is formed by etching the first insulating layer for the first time and the second time, thereby simplifying the process of fabricating the field insulating layer of the LDMOS transistor and improving the fabrication efficiency.

BRIEF DESCRIPTION OF THE DRAWINGS

Aforementioned and other objectives, characteristics and advantages of the present disclosure will become clearer from the following description of the embodiments thereof taken in conjunction with the drawings.

DETAILED DESCRIPTION OF EMBODIMENTS

Figure 1:
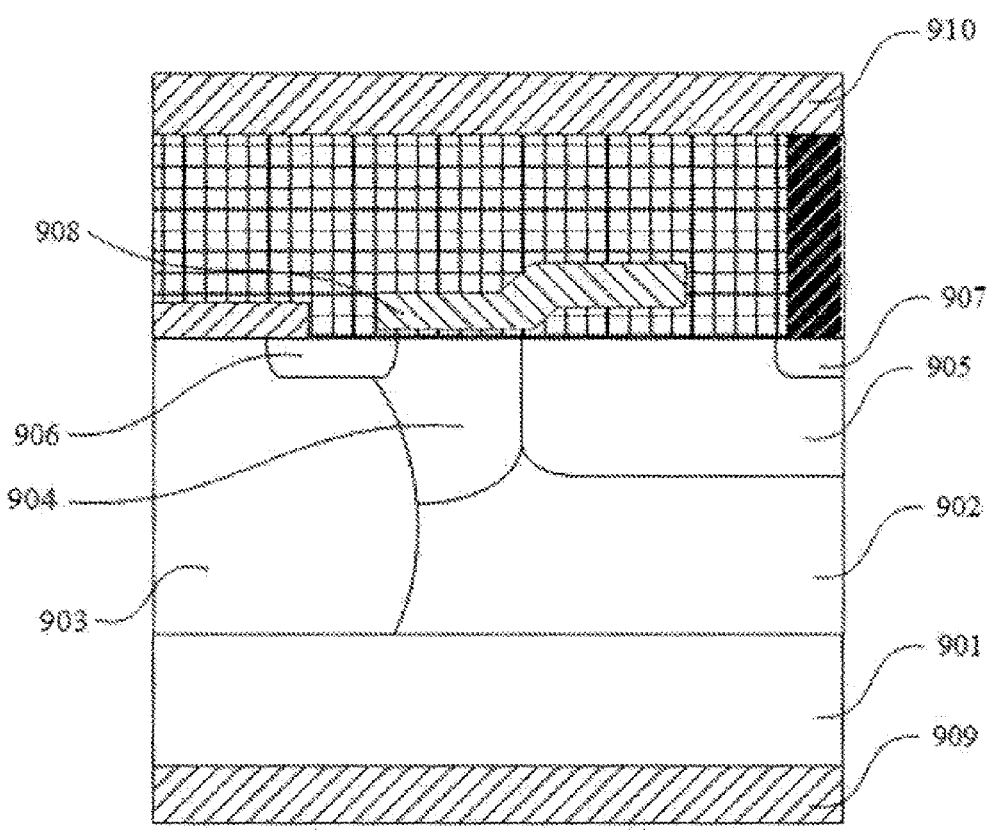
FIG. 1 is a cross-sectional view of an LDMOS transistor according to the conventional technology.

The present disclosure is described in detail with reference to the drawings. In the drawings, identical elements are denoted with the similar reference numerals. Parts of the drawings are not necessarily drawn to scale for clarity. Furthermore, some well-known parts are not illustrated. For simplicity, a semiconductor structure acquired after several steps may be shown in one figure.

In the description of the structure of devices, it should be understood that when one layer or one region is referred to as being located "on" or "above" a layer or the other region, it can be directly located on the other layer or the other region, alternatively, other layers or regions may be located therebetween. Furthermore, in a case that the device is overturned, the one layer or the one region may be located "under" or "below" the other layer or the other region.

In order to describe a case in which one layer or one region is directly located on the other layer or the other region, depictions such as "A is directly on B" or "A is on and adjacent to B" are used herein. In the present disclosure, a depiction "A is directly located in B" indicates that A is in and adjacent to B, rather than A is in a doped region of B.

Some specific details of the present disclosure are described, such as a structure, a material, a dimension, a process and a technology of a device, for a better understanding of the present disclosure. But as will be appreciated by those skilled in the art, the present disclosure may be practiced without these specific details.

Figure 2:
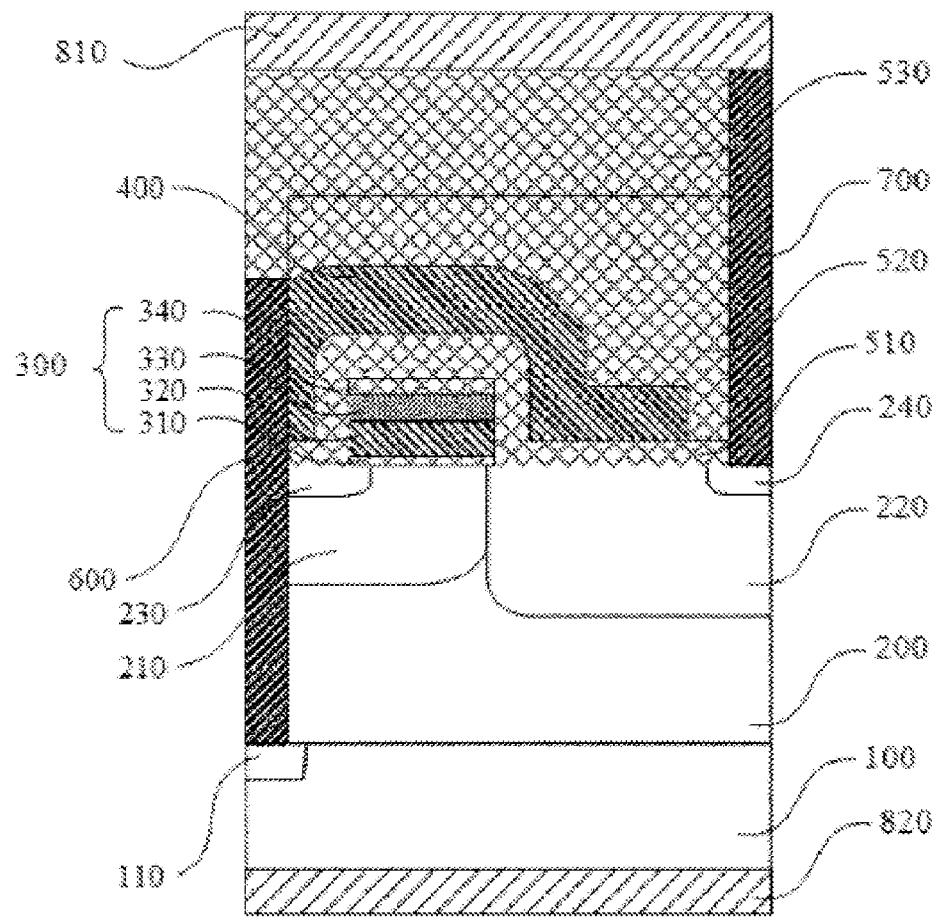
FIG. 2 is a cross-sectional view of an LDMOS transistor according to an embodiment of the present disclosure.

FIG. 2 is a cross-sectional view of an LDMOS transistor according to an embodiment of the present disclosure.

Referring to FIG. 2, substrate 100 is made of silicon and is doped with dopant of a first doping type. The first doping type is one of an N type and a P type, and the second doping type is the other one of the N type and the P type. The N-type dopant (such as phosphine (P) or arsenic (As)) may be implanted in an epitaxial semiconductor layer or region to form an N-type epitaxial semiconductor layer or region. The P-type dopant (such as boron (B)) may be implanted in epitaxial layer 200 or region to form P-type epitaxial layer 200 or region. In an example, substrate 100 is doped with the P-type dopant.

Epitaxial layer 200 doped with dopant of the first doping type is located on the upper surface of substrate 100, and is made of, for example, silicon. Epitaxial layer 200 is lightly doped as compared with substrate 100. Substrate 100 is thinned from a lower surface (opposite to the upper surface) of substrate 100 by a thinning process, so that source electrode 820 is located on the lower surface of substrate 100. Substrate 100 and epitaxial layer 200 respectively include a first region and a second region, where the first region is located under gate structure 300 and the second region is located adjacent to the first region in the lateral direction. Body contact region 110 doped with dopant of the first doping type is located in substrate 100, and specifically in the first region of substrate 100. The first region of substrate 100 corresponds to the first region of epitaxial layer 200, that is, the first region of epitaxial layer 200 is located above the first region of substrate 100. The second region of substrate 100 corresponds to the second region of epitaxial layer 200, that is, the second region of epitaxial layer 200 is located above the second region of substrate 100.

Body region 210 is located in epitaxial layer 200, and specifically in the first region of epitaxial layer 200, and is doped with dopant of the first doping type. Drift region 220 is located in epitaxial layer 200, and specifically in the second region of epitaxial layer 200, and is doped with dopant of the second doping type. Body region 210 may be in contact with drift region 220 in epitaxial layer 200. Source region 230 is located in the first region of epitaxial layer 200, and specifically in body region 210, where source region 230 is separated from drift region 220 by body region 210. Drain region 240 is located in the second region of epitaxial layer 200, and specifically in drift region 220.

Gate structure 300 is located on an upper surface of epitaxial layer 200. Further, gate structure 300 is located on body region 210 and a portion of source region 230. Gate structure 300 includes gate dielectric layer 310, gate conductor 320, silicide layer 330 and fourth insulating layer 340. Gate conductor 320 is separated from epitaxial layer 200 by gate dielectric layer 310. Silicide layer 330 is located on gate conductor 320. Fourth insulating layer 340 is located on silicide layer 330. Dimensions of gate dielectric layer 310, gate conductor 320, silicide layer 330 and fourth insulating layer 340 correspond to each other.

First insulating layer 510 is the field insulating layer of the LDMOS transistor, and is located on epitaxial layer 200 and gate structure 300. Specifically, first insulating layer 510 includes a first horizontal portion located on epitaxial layer 200, vertical portions located on two sidewalls of gate structure 300 and a second horizontal portion located on gate structure 300. That is, first insulating layer 510 has a protrusive structure which conforms to gate structure 300. It should be noted that both body region 210 and drift region 220 are located in epitaxial layer 200. Source region 230 is located in body region 210. Therefore, the portion of first insulating layer 510 located on epitaxial layer 200 includes portions thereof located on body region 210, drift region 220 and source region 230.

Shield conductor layer 400 is located on first insulating layer 510. Specifically, shield conductor layer 400 conforms to first insulating layer 510. A portion of first insulating layer 510 located on drift region 220 is exposed through shield conductor layer 400. Shield conductor layer 400 severs as a field plate of the LDMOS transistor.

Second insulating layer 520 is located on shield conductor layer 400 and the portion of first insulating layer 510 exposed through shield conductor layer 400. Second insulating layer 520 severs as the hard mask for forming first conductive path 600.

First conductive path 600 extends from second insulating layer 520 to body contact region 110 in substrate 100, and is in contact with body contact region 110. First conductive path 600 sequentially passes through second insulating layer 520, shield conductor layer 400, first insulating layer 510, source region 230, body region 210 and epitaxial layer 200, to connect source region 230 with substrate 100, and electrically connect shield conductor layer 400, source region 230 and body contact region 110, such that the field plate of the LDMOS transistor has the same electric potential as that of source region 230. Preferably, first conductive path 600 sequentially passes through second insulating layer 520, a protrusive sidewall of shield conductor layer 400, first insulating layer 510, source region 230, body region 210 and epitaxial layer 200. Since a contact area between the protrusive sidewall of shield conductor layer 400 and first conductive path 600 is lager, the reliability of the LDMOS transistor is further improved.

Third insulating layer 530 is located on second insulating layer 520 and first conductive path 600. Second conductive path 700 extends from third insulating layer 530 toward epitaxial layer 200, through third insulating layer 530, second insulating layer 520 and first insulating layer 510 sequentially, and eventually comes in contact with drain region 240.

According to the embodiment of the present disclosure, the LDMOS transistor has first conductive path 600 with a high aspect ratio located in the first region of epitaxial layer 200. Source region 230 is connected with substrate 100 by first conductive path 600, so that source electrode 820 can be arranged on the lower surface of the substrate 100. Not only can the size of the LDMOS transistor be reduced, but also the resistance can be reduced due to first conductive path 600 with a high aspect ratio, such that the product performance is improved.

FIGS. 3a to 3k are cross-sectional views showing stages of manufacturing an LDMOS transistor according to an embodiment of the present disclosure.

Figure 3A:
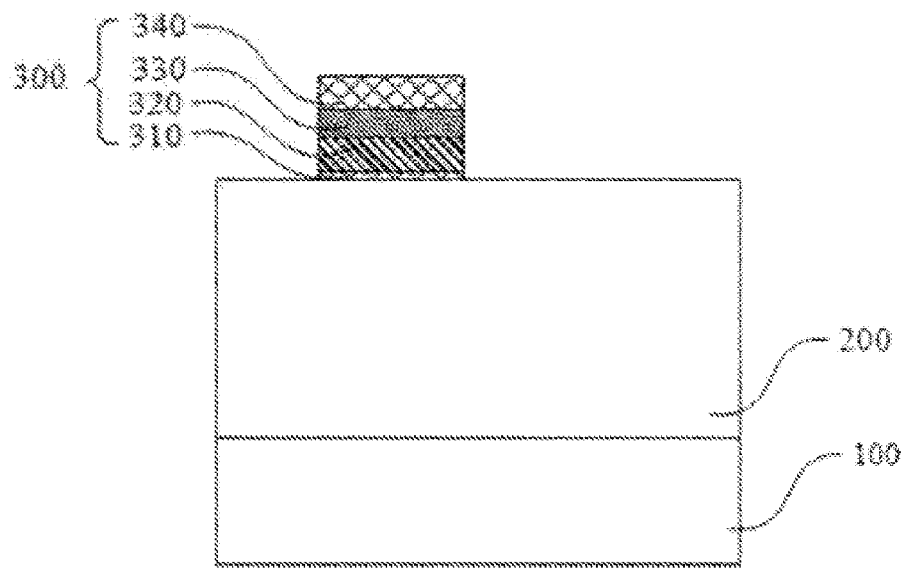
FIGS. 3a to 3k are cross-sectional views showing stages of manufacturing an LDMOS transistor according to an embodiment of the present disclosure.

Referring to FIG. 3a, epitaxial layer 200 is formed on the upper surface of substrate 100. Gate dielectric layer 310 is formed on the upper surface of epitaxial layer 200 by a thermal oxidation process. Gate conductor 320 is formed on gate dielectric layer 310. Silicide layer 330 is formed on gate conductor 320. Fourth insulating layer 340 is formed on silicide layer 330. Gate dielectric layer 310, gate conductor 320, silicide layer 330 and fourth insulating layer 340 are etched by a conventional etching process, to form gate structure 300, so that gate structure 300 is located on a portion of the upper surface of epitaxial layer 200. In the present embodiment, gate dielectric layer 310 and fourth insulating layer 340 are formed of an oxide such as a silicon oxide. In an alternative embodiment, gate dielectric layer 310 and fourth insulating layer 340 may be formed of a nitride such as a silicon nitride. Silicide layer 330 may include a silicide having a transition metal, for example, titanium (Ti) or tungsten (W).

Figure 3B:
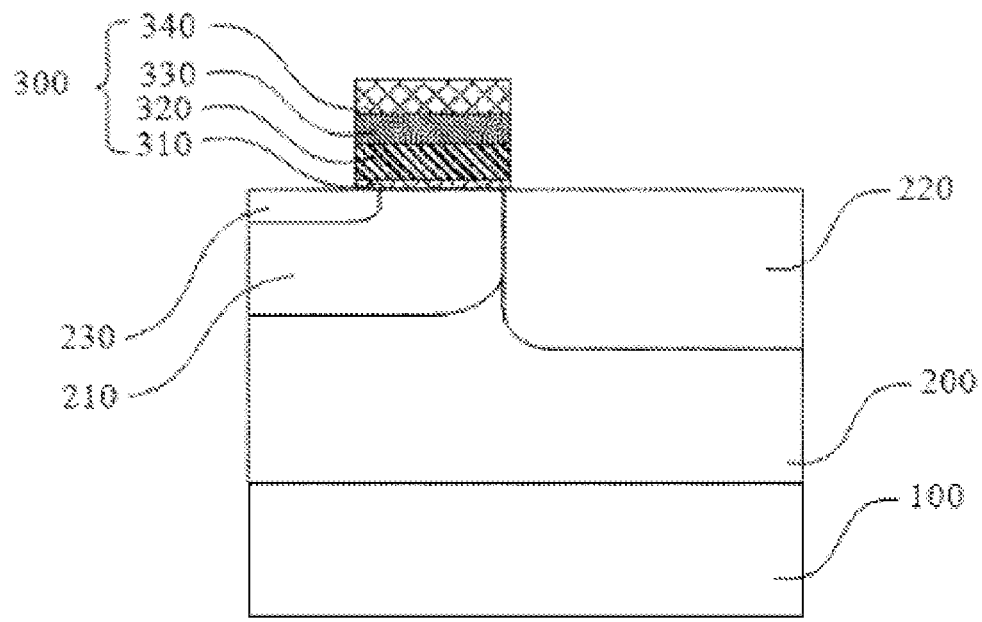

Subsequently, referring to FIG. 3b, N-type ions are implanted by a self-alignment process and by using the above gate structure 300 as a mask, to form drift region 220 in epitaxial layer 200. Drift region 220 is located in the second region of epitaxial layer 200. P-type ions are implanted by a self-alignment process and by using the above gate structure 300 as a mask, to form body region 210 in epitaxial layer 200. Body region 210 is located in the first region of epitaxial layer 200. Next, a heat treatment process, such as an annealing process, is performed, so that the formed body region 210 is diffused in epitaxial layer 200, and eventually comes in contact with drift region 220. Source region 230 is formed in body region 210 by implanting N-type ions, where source region 230 is located in the first region of epitaxial layer 200, and is isolated form drift region 220 by body region 210.

Figure 3C:
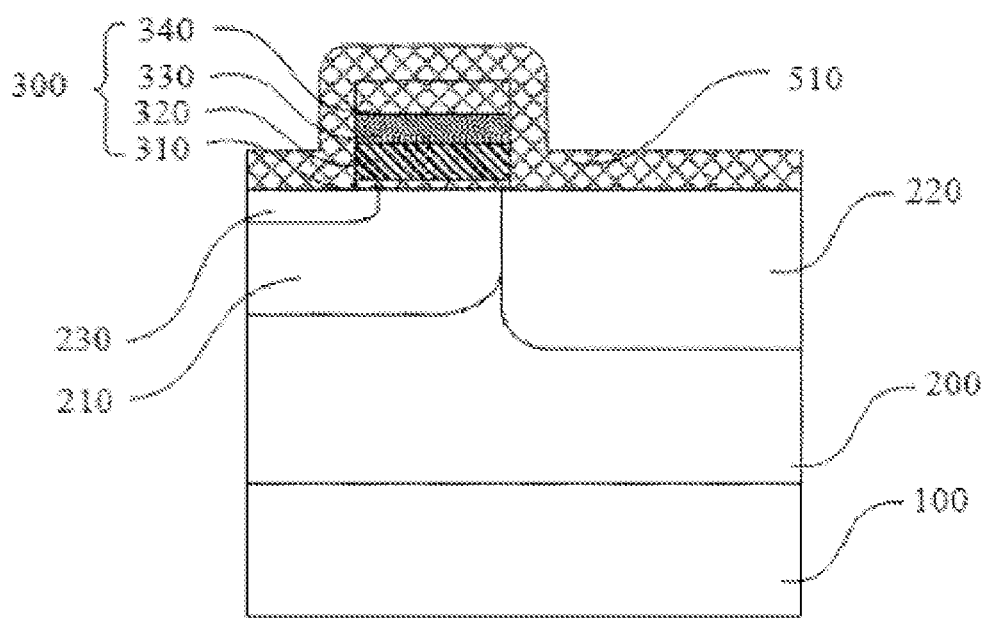

Subsequently, referring to FIG. 3c, first insulating layer 510 is deposited on epitaxial layer 200 and gate structure 300, so that insulating layer 510 covers the upper surface of epitaxial layer 200, an upper surface of gate structure 300 and sidewalls of gate structure 300. A shape of first insulating layer 510 corresponds to the upper surface of epitaxial layer 200 and the upper surface of gate structure 300. Specifically, first insulating layer 510 is protruded at the position of gate structure 300. First insulating layer 510 may be an oxide layer.

Figure 3D:
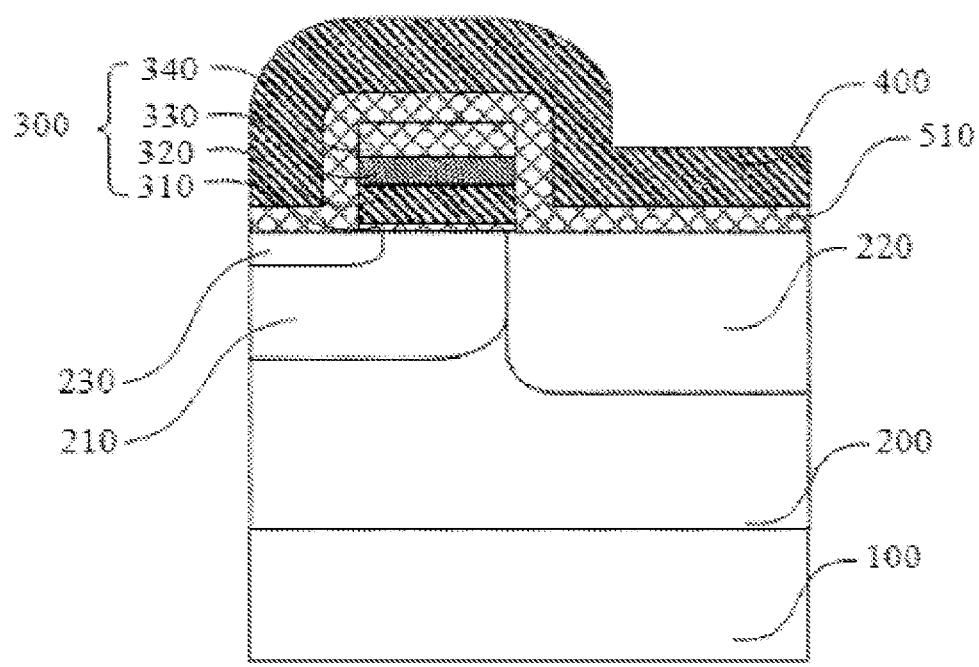

Subsequently, referring to FIG. 3d, shield conductor layer 400 that conforms to first insulating layer 510 is formed on first insulating layer 510. Shield conductor layer 400 covers first insulating layer 510. Specifically, two ends of shield conductor layer 400 extend to the surface of epitaxial layer 200. Shield conductor layer 400 may be formed of a doped polysilicon.

Figure 3E:
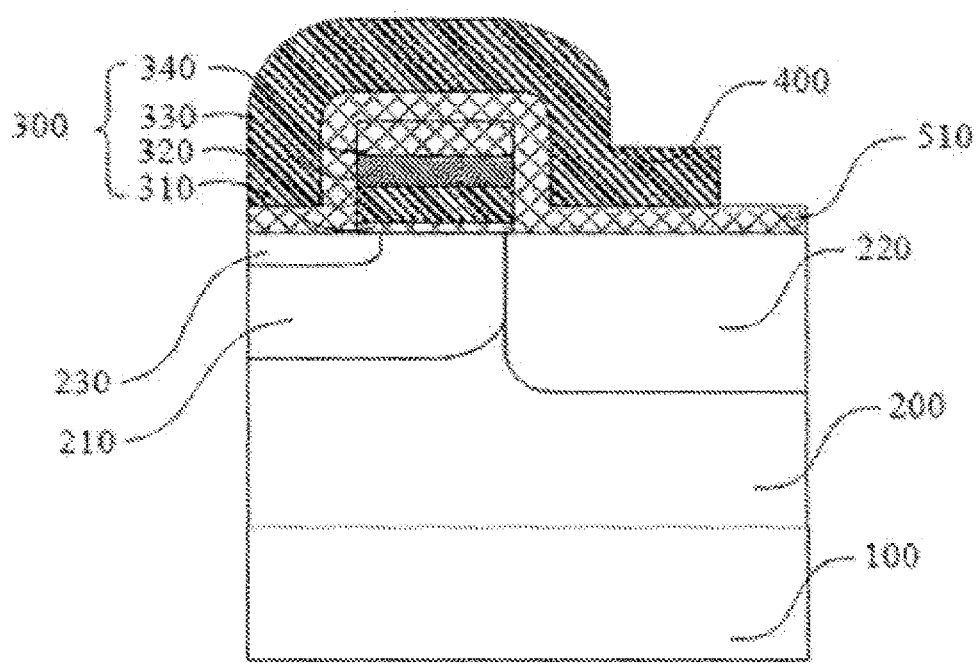

Subsequently, referring to FIG. 3e, an end of shield conductor layer 400 proximate to the second region of epitaxial layer 200 is etched by an etching process, so that at least a portion of first insulating layer 510 proximate to the second region of epitaxial layer 200 is exposed. After being etched, shield conductor layer 400 severs as the field plate of the LDMOS transistor.

Figure 3F:
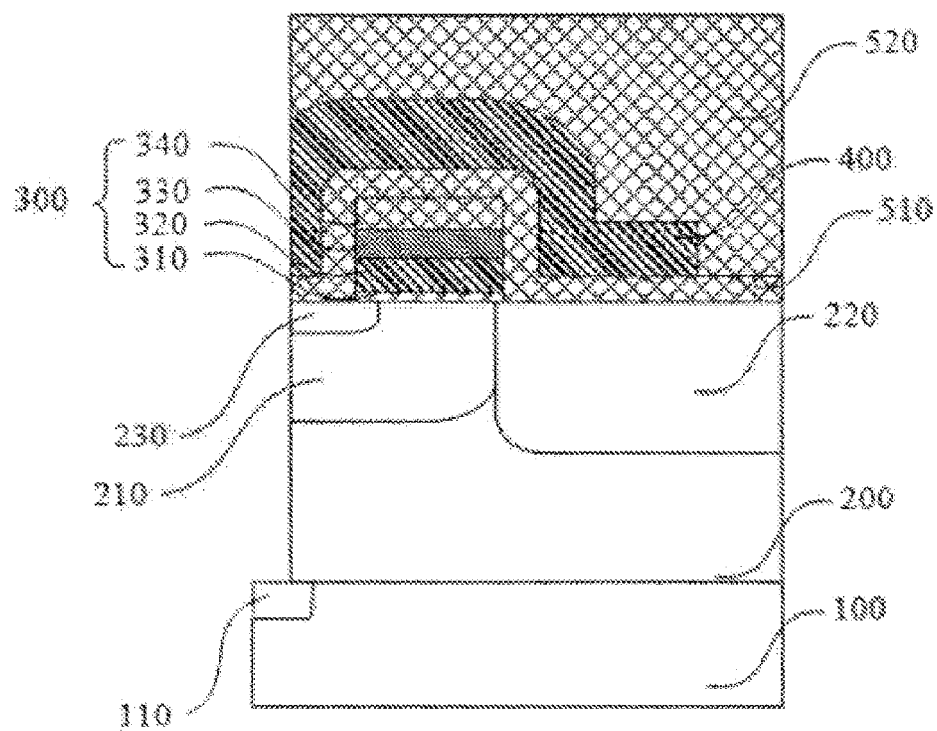

Subsequently, referencing to FIG. 3f, second insulating layer 520 is deposited on shield conductor layer 400 and the exposed portion of first insulating layer 510. An upper surface of second insulating layer 520 is treated, for example, by a chemical mechanical polishing process. Second insulating layer 520, shield conductor layer 400, first insulating layer 510, source region 230, body region 210 and epitaxial layer 200 are sequentially etched by an etching process and by using second insulating layer 520 as a hard mask, to form the first trench. The first trench extends through second insulating layer 520, shield conductor layer 400 and first insulating layer 510 to an upper surface of the first region of the epitaxial layer, and continues through source region 230, body region 210 and epitaxial layer 200 to the upper surface of substrate 100. Preferably, the first trench extends through second insulating layer 520, a protruded sidewall shield conductor layer 400 and first insulating layer 510 to the upper surface of the first region of epitaxial layer 200, and continues through source region 230, body region 210 and epitaxial layer 200 to the upper surface of substrate 100, such that a portion of the upper surface of substrate 100 is exposed through the first trench. Then P-type ions are implanted to form body contact region 110 in substrate 100. Second insulating layer 520 may be an oxide layer.

Figure 3G:
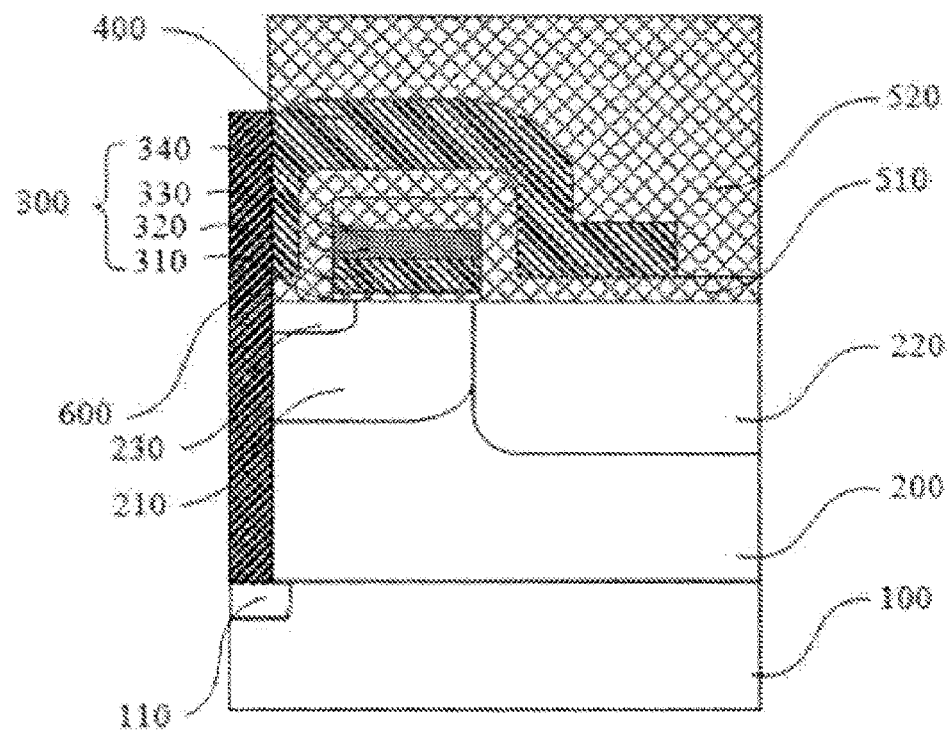

Subsequently, referring to FIG. 3g, the first trench is filled with a conductive material to form first conductive path 600. Specifically, the conductive material is deposited in the first trench and on second insulating layer 520, so that the first trench is filled with the conductive material. Then performing etched back process to remove the conductive material outside the first trench, such that first conductive path 600 is formed in the first trench. In an embodiment, first conductive path 600 extends from second insulating layer 520 toward substrate 100, through shield conductor layer 400, first insulating layer 510, source region 230, body region 210 and epitaxial layer 200 sequentially to the upper surface of substrate 100. That is, one end of first conductive path 600 reaches the upper surface of substrate 100 and is in contact with body contact region 110, while the other end of first conductive path 600 reaches the protruded surface of shield conductor layer 400, so that source region 230 is connected with substrate 100 by shield conductor layer 400. Furthermore, first conductive path 600 being in contact with shield conductor layer 400 allows the electric potential of the field plate of the LDMOS transistor to be equal to the electric potential of source region 230 of the LDMOS transistor, which is, for example, zero potential. The conductive material may be a tungsten silicide or other suitable conductive materials.

Figure 3H:
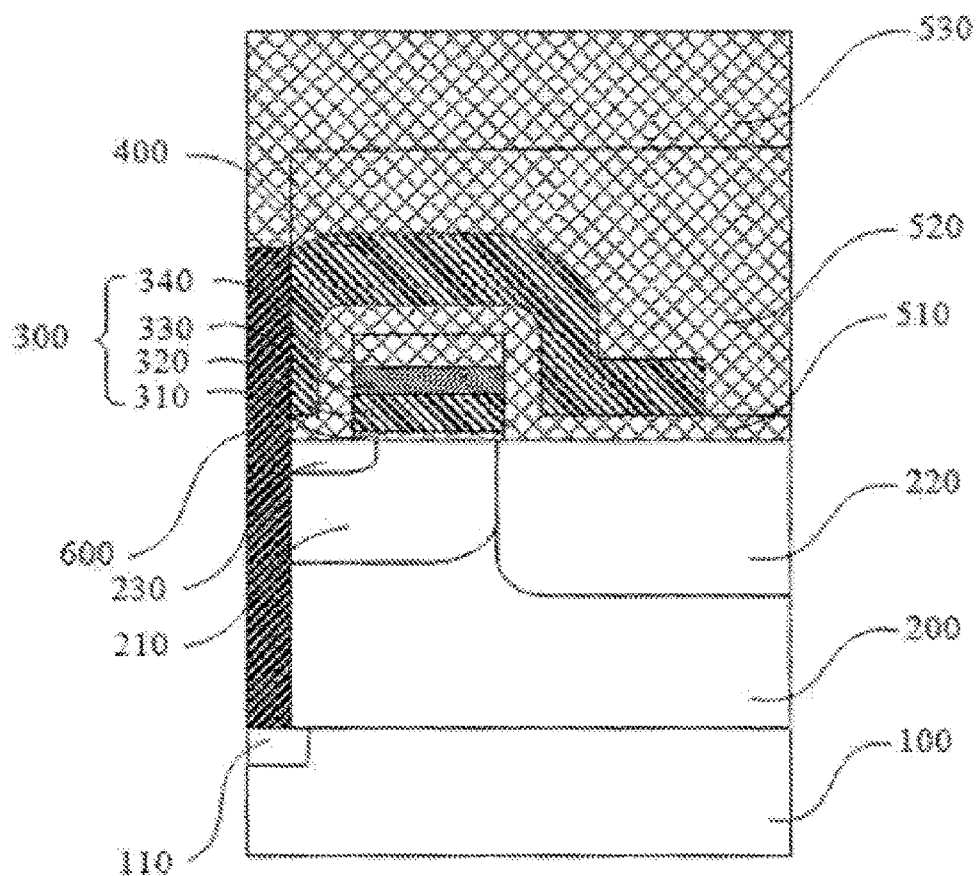

Subsequently, referring to FIG. 3h, third insulating layer 530 is deposited on first conductive path 600 and second insulating layer 520, where third insulating layer 530 covers the upper surface of first conductive path 600 and the upper surface of second insulating layer 520. The third insulating layer may be an oxide layer.

Figure 3I:
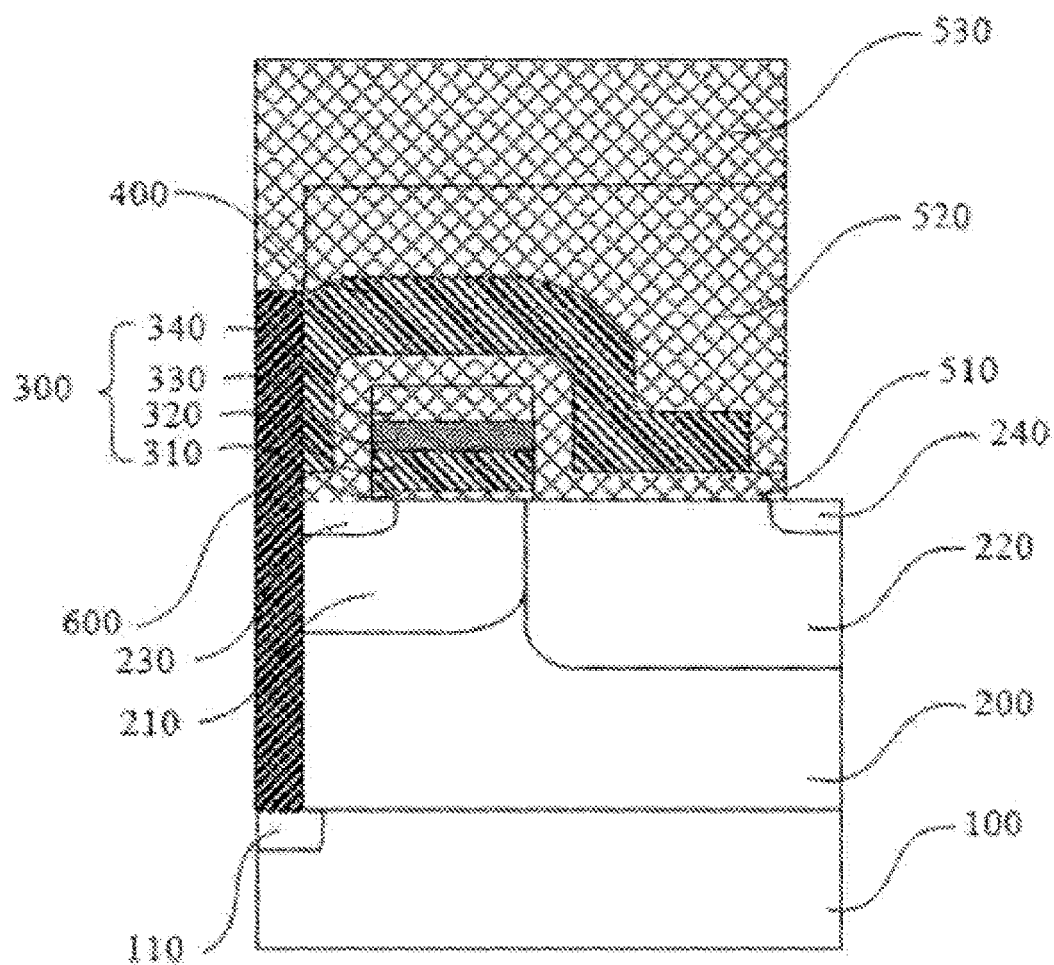

Subsequently, referring to FIG. 3i, first insulating layer 510, second insulating layer 520 and third insulating layer 530 located on an upper surface of the second region of epitaxial layer 200 are etched by an etching process, to expose a portion of the upper surface of the second region of epitaxial layer 200, thereby forming the second trench by using third insulating layer 530 as a mask. The second trench extends from third insulating layer 530 toward epitaxial layer 200, through second insulating layer 520 and first insulating layer 510 sequentially, to the upper surface of drift region 220. That is, one end of the second trench reaches the upper surface of third insulating layer 530, while the other end of the second trench reaches the upper surface of epitaxial layer 200. N-type ions are implanted to form drain region 240 on the exposed portion of epitaxial layer 200, where drain region 240 is located in drift region 220 and the second region of epitaxial layer 200.

In the process of forming the first trench, first insulating layer 510 is etched for the first time to define a position of a first sidewall of a field insulating layer of the LDMOS transistor. In the process of forming the second trench, first insulating layer 510 is etched for the second time to define a position of a second sidewall of the field insulating layer of the LDMOS transistor. That is, the field insulating layer of the LDMOS transistor is formed by etching first insulating layer 510 for the first time and the second time.

Figure 3J:
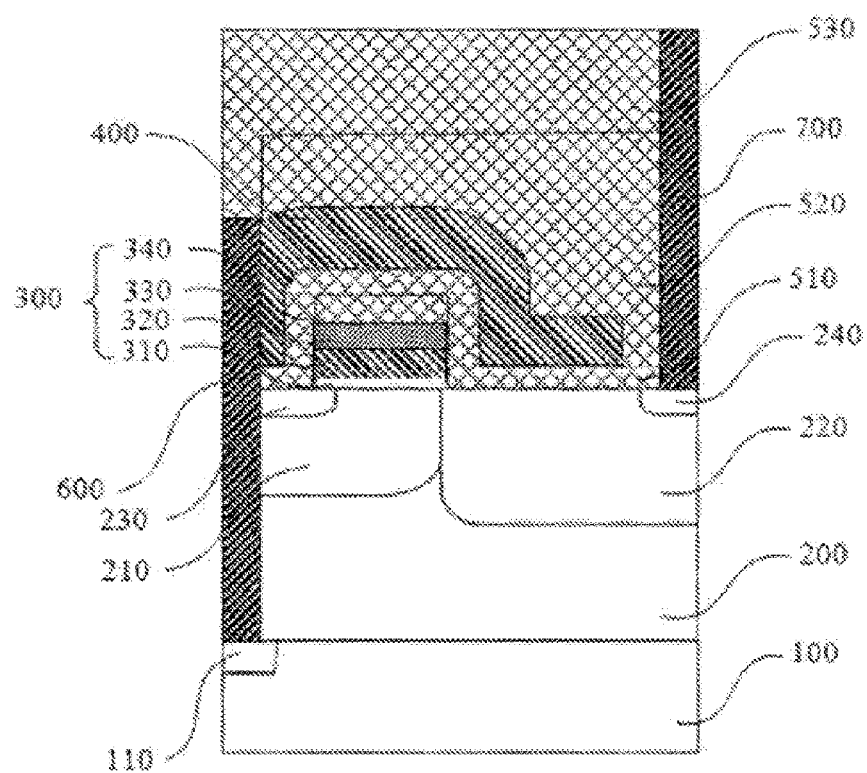

Subsequently, referring to FIG. 3j, a conductive material is deposited in the second trench to form the second conductive path 700. On end of second conductive path 700 reaches the upper surface of third insulating layer 530, while the other end of second conductive path 700 reaches the upper surface of epitaxial layer 200 and is in contact with drain region 240.

Figure 3K:
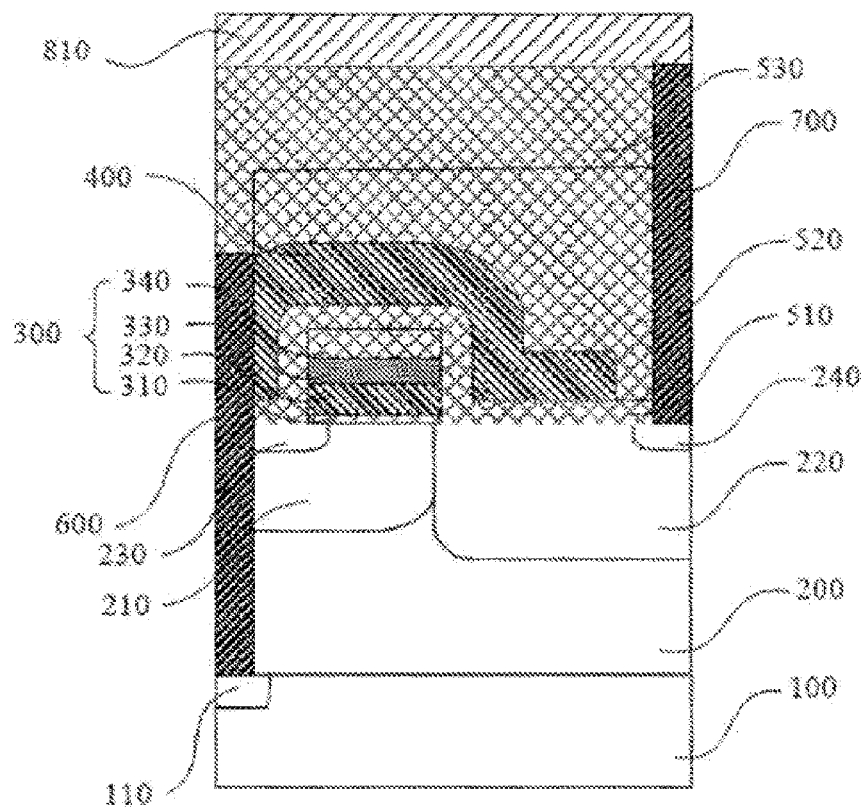

Subsequently, referring to FIG. 3k, drain electrode 810 is formed on the upper surface of third insulating layer 530. Drain electrode 810 is connected with drain region 240 through second conductive path 700.

Subsequently, referring to FIG. 2, substrate 100 is thinned from the lower surface by a thinning process. Then a metal layer is deposited on the lower surface of substrate 100 to form source electrode 820. Source electrode 820 is electrically connected with source region 230 and shield conductor layer 400 through first conductive path 600.

In the aforementioned embodiment, each of first conductive path 600, second conductive path 700, source electrode 820, gate conductor 320, shield conductor layer 400 and drain electrode 810 is formed of a conductive material including a metal material such as an aluminum alloy or copper.

In the LDMOS transistor according to the embodiments of the present disclosure, after the field plate is formed, second insulating layer 520 is formed on the field plate and severs as the hard mask, so that the first trench with a high aspect ratio is formed at a position corresponding to the first region of epitaxial layer 200, thereby forming first conductive path 600 with a high aspect ratio. Source region 230 is connected with substrate 100 through the formed first conductive path 600, such that source region 230 is connected with source electrode 820 located on the lower surface of substrate 100 through first conductive path 600. Not only can the size of the LDMOS transistor be reduced but also the resistance can be reduced due to first conductive path 600 with a high aspect ratio, such that the product performance is improved.

Finally, it should be further noted that the relationship terminologies such as "first", "second" and the like are only used herein to distinguish one entity or operation from another, rather than to necessitate or imply that the actual relationship or order exists between the entities or operations. Furthermore, terms of "include", "comprise" or any other variants are intended to be non-exclusive. Therefore, a process, method, article or device including a plurality of elements includes not only the elements but also other elements that are not enumerated, or also include the elements inherent for the process, method, article or device. Unless expressively limited otherwise, the statement "comprising (including) one . . . " does not exclude the case that other similar elements may exist in the process, method, article or device.

Embodiments of the present disclosure, as illustrated above, do not provided all details and are not to limit the present disclosure. Obviously, many modifications and variations are possible according to the above description. Those embodiments were chosen and described herein to better illustrate the principles of the present disclosure and practical application thereof, so that those skilled in the art can better utilize the present disclosure and modify based on the present disclosure. Therefore, the present disclosure should be limited only by the appended claims, as well as all scopes and equivalents thereof.

We claim:

1. A method for manufacturing an LDMOS (laterally diffused metal oxide semiconductor) transistor, comprising:
    forming an epitaxial layer having a first doping type on a substrate having said first doping type;
    forming a gate structure on an upper surface of said epitaxial layer;
    forming a body region having said first doping type and a drift region having a second doping type in said epitaxial layer, and forming a source region having said second doping type in said body region, wherein said second doping type is opposite to said first doping type;
    forming a first insulating layer on both said gate structure and an upper surface of said epitaxial layer;
    forming a shield conductor layer on said first insulating layer, wherein the shield conductor layer comprises a first vertical portion, a second vertical portion, a first horizontal portion and a second horizontal portion, said first horizontal portion is located between said first vertical portion and said second vertical portion, and is in contact with a first end of said first vertical portion and a first end of said second vertical portion, said second horizontal portion is in contact with a second end of said second vertical portion, said first end of said second vertical portion is opposite to said second end of said second vertical portion; and
    forming a first trench, wherein said first trench extends vertically through said first vertical portion of said shield conductor layer, said first insulating layer, said source region, said body region, and said epitaxial layer, to a upper surface of a body contact region in said substrate;
    filling said first trench with a conductive material to form a first conductive path,
    wherein said first conductive path sequentially passes through said first vertical portion of said shield conductor layer, said first insulating layer, said source region, said body region and said epitaxial layer, to said upper surface of the body contact region in said substrate, to connect said source region with said substrate, and electrically connect said shield conductor layer, said source region and said body contact region, wherein said first vertical portion is in contact with said first conductive path;
    wherein said first conductive path is in contact with a side wall of said first insulating layer; and
    wherein said source region is isolated from said shield conductor layer by said first insulating layer.

2. The method according to claim 1, wherein the forming said first conductive path comprises:
    forming a second insulating layer covering said shield conductor layer; and
    forming said first conductive path by using said second insulating layer as a hard mask, wherein said first conductive path extends from said second insulating layer to an upper surface of said substrate, to connect said source region with said substrate; and
    wherein after forming said first conductive path, the method further comprises forming a drain region having said second doping type in said drift region.

3. The method according to claim 2, wherein said forming said first conductive path comprises:
   forming the first trench by using said second insulating layer as a hard mask, wherein said first trench extends from said second insulating layer to said upper surface of said substrate, to expose said substrate; and
   wherein said first conductive path extends from said second insulating layer toward said substrate, through said shield conductor layer, said first insulating layer, said source region, said body region and said epitaxial layer sequentially to said upper surface of said substrate.

4. The method according to claim 3, wherein before filling said first trench, the method further comprises:
   forming said body contact region having said first doping type in said substrate exposed by said first trench, wherein said body contact region is connected with said source region through said first conductive path.

5. The method according to claim 2, wherein after forming said shield conductor layer, said method further comprises:
   etching said shield conductor layer, to expose at least a portion of said first insulating layer which is located on an upper surface of said drift region, wherein said second insulating layer covers said exposed portion of said first insulating layer.

6. The method according to claim 2, wherein said forming said drain region comprises:
   forming a third insulating layer on said second insulating layer and said first conductive path;
   forming a second trench by using said third insulating layer as a hard mask, wherein said second trench extends from said third insulating layer toward said epitaxial layer, through said second insulating layer and said first insulating layer sequentially, to reach an upper surface of said drift region, and expose said drift region; and
   forming said drain region in said drift region exposed by the second trench.

7. The method according to claim 6, further comprising:
   forming a second conductive path by filling said second trench with a conductive material, and forming a drain electrode on both an upper surface of said third insulating layer and an upper surface of said second conductive path, wherein said drain region is connected with said drain electrode through said second conductive path.

8. The method according to claim 2, wherein the forming said gate structure comprises:
   forming a gate dielectric layer on said upper surface of said substrate;
   forming a gate conductor on said gate dielectric layer;
   forming a silicide layer on said gate conductor;
   forming a fourth insulating layer on said silicide layer; and
   etching said fourth insulating layer, said silicide layer, said gate conductor, and said gate dielectric layer sequentially, to form said gate structure on said upper surface of said substrate.

9. The method according to claim 2, wherein said forming said body region comprises:
   doping a first region of said epitaxial layer with dopant of said first doping type by using said gate structure as a mask, to form said body region.

10. The method according to claim 2, wherein said forming said drift region comprises:
    doping a second region of said epitaxial layer with dopant of said second doping type by using said gate structure as a mask, to form said drift region.

11. The method according to claim 2, further comprising:
    forming a source electrode on a lower surface of said substrate, wherein said source electrode is electrically connected with said source region and said shield conductor layer through said first conductive path.

12. The method according to claim 2, wherein before forming said first conductive path, said method further comprises:
    etching said shield conductor layer, said first insulating layer, and said epitaxial layer.

* * * * *